United States Patent
Tang et al.

(10) Patent No.: US 8,069,329 B1
(45) Date of Patent: Nov. 29, 2011

(54) INTERNALLY TRIGGERED RECONFIGURATION OF PROGRAMMABLE LOGIC DEVICES

(75) Inventors: Howard Tang, San Jose, CA (US); Roger Spinti, Milpitas, CA (US); Jeff Byrne, Hillsboro, OR (US); Clark Wilkinson, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 919 days.

(21) Appl. No.: 12/021,202

(22) Filed: Jan. 28, 2008

(51) Int. Cl.
*G06F 12/00* (2006.01)

(52) U.S. Cl. .................. 711/170; 711/103; 711/165

(58) Field of Classification Search .................. None
See application file for complete search history.

(56) References Cited

U.S. PATENT DOCUMENTS

| | | | |
|---|---|---|---|
| 6,907,595 B2 * | 6/2005 | Curd et al. | 326/41 |
| 6,920,627 B2 * | 7/2005 | Blodget et al. | 716/117 |
| 7,088,132 B1 | 8/2006 | Tang et al. | |
| 7,095,247 B1 | 8/2006 | Tang et al. | |
| 7,301,822 B1 | 11/2007 | Walstrum | |
| 2007/0182445 A1 | 8/2007 | Chen et al. | |

OTHER PUBLICATIONS

U.S. Appl. No. 11/447,591, Spinti et al.
U.S. Appl. No. 11/446;548, Tang et al.
U.S. Appl. No. 11/446,309, Tang et al.
Altera Corporation, Cyclone Device Handbook, vol. 1, 13. Configuring Cyclone FPGAs, Aug. 2005, 50 pages.
Lattice Semiconductor Corporation, Low-Cost FPGA Configuration Via Industry-Standard SPI Serial Flash, A Lattice Semiconductor White Paper, Jun. 2004, 13 pages.
Xilinx™, Configuring Spartan-3E Xininx FPGAs with SPI Flash Memories, Arthur Khu, Jan. 3, 2006, 16 pages.
ST Microelectronics, M25P80, 8 Mbit, Low Voltage, Serial Flash Memory With 40MHz SPI Bus Interface, Aug. 2004, 41 pages.

* cited by examiner

*Primary Examiner* — Shawn X Gu
(74) *Attorney, Agent, or Firm* — Haynes and Boone, LLP

(57) ABSTRACT

Various techniques are described to provide an internally triggered reconfiguration of a programmable logic device (PLD). In one example, a PLD includes configuration memory adapted to store first configuration data to configure the PLD for its intended function. The PLD also includes a bus interface adapted to interface with configuration data storage memory. The PLD further includes user logic configured by the first configuration data and adapted to provide a reconfiguration signal to trigger a reconfiguration of the PLD. In addition, the PLD includes a bus interface controller responsive to the reconfiguration signal for loading second configuration data from the configuration data storage memory via the bus interface.

20 Claims, 3 Drawing Sheets

INTERNALLY TRIGGERED RECONFIGURATION OF PROGRAMMABLE LOGIC DEVICES

TECHNICAL FIELD

The present invention relates generally to programmable logic devices and, more particularly, to the reconfiguration of programmable logic devices.

BACKGROUND

Programmable logic devices (PLDs), such as field programmable gate arrays (FPGAs) or complex programmable logic devices (CPLDs), may be programmed with configuration data (sometimes referred to as a configuration bitstream) to provide various user-defined features. In certain applications, configuration data may be programmed into an external non-volatile memory such as a flash memory. The configuration data may be loaded from the external non-volatile memory into the PLD and programmed into volatile configuration memory of the PLD.

After a PLD has been configured through the programming of configuration data into the configuration memory, the PLD may be reconfigured through the programming of new or different configuration data into the configuration memory. For example, in one prior approach, a PLD reconfiguration process may be performed in response to the toggling of an external pin of the PLD. In another approach, a PLD may be reconfigured in response to an instruction received by the PLD through, for example, an external joint test action group (JTAG) port (e.g., employing standards such as Institute of Electrical and Electronics Engineers (IEEE) 1149.1 or 1532 standards).

However, in each of these prior approaches, toggle signals or instructions must be provided to the PLD from external hardware in order to trigger a reconfiguration. But external hardware may not always be apprised of processes occurring in the PLD and therefore may not always know when a reconfiguration should be performed. External hardware may also be unaware of the location of new configuration data to be provided to the PLD for reconfiguration. Accordingly, there is a need for an improved approach to the reconfiguration of a PLD that, for example, does not rely on the PLD receiving external signals or instructions.

SUMMARY

In accordance with one embodiment of the present invention, a programmable logic device (PLD) includes configuration memory adapted to store first configuration data to configure the PLD for its intended function; a bus interface adapted to interface with configuration data storage memory; user logic configured by the first configuration data and adapted to provide a reconfiguration signal to trigger a reconfiguration of the PLD; and a bus interface controller responsive to the reconfiguration signal for loading second configuration data from the configuration data storage memory via the bus interface.

In accordance with another embodiment of the present invention, a method of configuring a programmable logic device (PLD) includes storing first configuration data in a configuration memory of the PLD to configure the PLD for its intended function; generating a reconfiguration signal internally within the PLD to trigger a reconfiguration of the PLD; loading second configuration data from configuration data storage memory in response to the reconfiguration signal; and programming the configuration memory with the second configuration data.

In accordance with another embodiment of the present invention, a programmable logic device (PLD) includes configuration memory adapted to store first configuration data to configure the PLD for its intended function; means for generating a reconfiguration signal internally within the PLD to trigger a reconfiguration of the PLD; means for storing second configuration data; means responsive to the reconfiguration signal for loading the second configuration data from the storing means; and means for programming the configuration memory with the second configuration data.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of integrated circuits and applications. As an exemplary implementation, a programmable logic device (PLD) will be utilized to illustrate the techniques in accordance with one or more embodiments of the invention. However, it should be understood that this is not limiting and that the techniques disclosed herein may be implemented as desired, in accordance with one or more embodiments of the invention, within various types of circuits.

In accordance with various embodiments described herein, a PLD may be implemented to support reconfiguration in response to an internal signal provided by the PLD. For example, in one embodiment, such a PLD may trigger the loading of configuration data into configuration memory of the PLD in response to a signal provided by user logic of the PLD. Advantageously, such a reconfiguration may be performed without relying on the toggling of external pins of the PLD or the receipt of a reconfiguration instruction from an external device. In various embodiments, the location of the configuration data may also be identified by user logic of the PLD or configuration data already loaded into the PLD.

Figure 1:
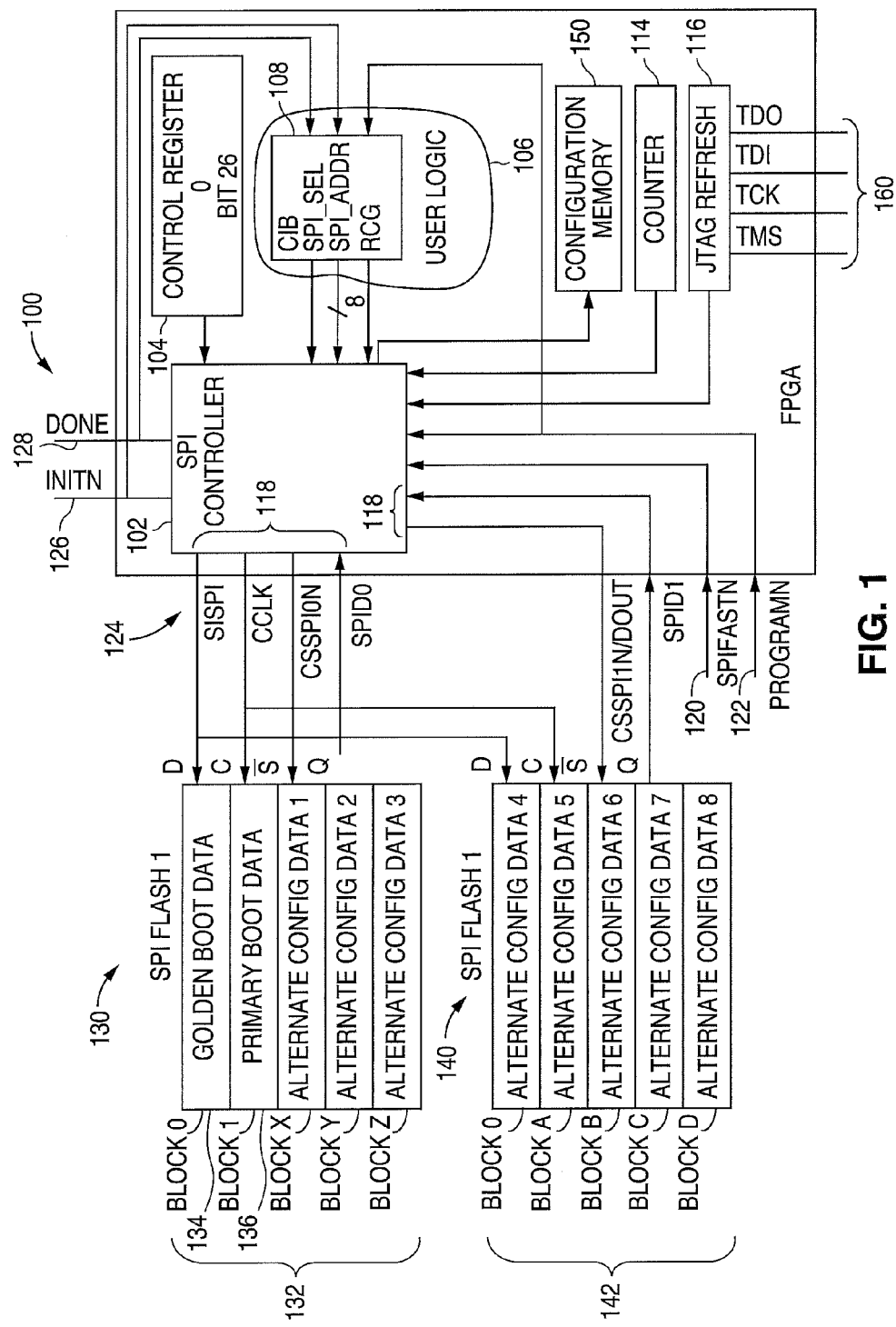
FIG. 1 illustrates a block diagram of an exemplary programmable logic device (PLD) and a plurality of external non-volatile memory devices in accordance with an embodiment of the invention.

FIG. 1 illustrates a block diagram of an exemplary programmable logic device (PLD) 100 and a plurality of external memory devices 130 and 140 in accordance with an embodiment of the invention. PLD 100 may be implemented as a field programmable gate array (FPGA) as shown in FIG. 1, a complex programmable logic device (CPLD), or other appropriate PLD as may be desired in particular applications.

In the embodiment illustrated in FIG. 1, PLD 100 is provided with a Serial Peripheral Interface (SPI) port 124 that is supported by a SPI controller 102 and a plurality of SPI pins 118 and 120 (labeled SISPI, CCLK, CSSPION, SPIDO, CSSPI1N/DOUT, SPID1, and SPIFASTN) to facilitate interfacing PLD 100 with external SPI-compatible devices. As understood by those skilled in the art, SPI is a serial bus standard established by Motorola Corporation and supported in silicon products from various manufacturers. In other embodiments, other serial or parallel bus interfaces and their compatible serial and parallel non-volatile memories may be used.

PLD 100 includes means such as SPI controller 102 for loading various configuration data from configuration data storage memory such as external memory device 130 or 140 into PLD 100 in response to a reconfiguration signal. PLD 100 also includes means such as SPI controller 102 for programming configuration memory 150 with such configuration data. Accordingly, means such as external memory device 130 or 140 or other configuration data storage memory may be used for storing such configuration data to be loaded into PLD 100 and programmed into configuration memory 150.

SPI pin 120 may configure SPI controller 102 to operate SPI pins 118 at various alternate speeds. For example, in one embodiment, SPI pins 118 may operate at speeds up to approximately 20 MHz if SPI pin 120 exhibits a first logic value, and may operate at speeds in the range of approximately 50-85 MHz if SPI pin 120 exhibits a second logic value. A PROGRAMN pin 122 may be used to trigger a loading of configuration data from an external non-volatile memory by initiating a reconfiguration process controlled by SPI controller 102 in which configuration data from a selected block of a selected one of external memory devices 130 or 140 is loaded into PLD 100 by SPI controller 102 and programmed into a configuration memory 150. SPI controller 102 also supports an INITN pin 126 and a DONE pin 128 which may be used to indicate the configuration status of PLD 100.

PLD 100 also includes a control register 104, a plurality of user logic 106, a common interface block (CIB) 108, a counter 114, and a JTAG block 116, all of which may be used by SPI controller 102 in the loading of configuration data from external SPI-compatible devices. In this regard, control register 104 stores a control bit value set by a user as part of configuration data loaded into PLD 100 and may be used by SPI controller 102 to determine a boot sequence of PLD 100. In one embodiment, control register 104 may be implemented as a 32 bit register with bit 26 providing the control bit value as illustrated in FIG. 1. However, it will be appreciated that other implementations of the control bit are also contemplated using, for example, other bits of control register 104, other registers, and/or other bit storage techniques.

PLD 100 includes means such as configuration memory 150 for storing configuration data to configure PLD 100 for its intended function. In this regard, user logic 106 is user-defined logic that is determined by the particular configuration data stored by configuration memory 150. User logic 106 and configuration memory 150 are typically implemented in an FPGA, for example, as an array of configurable logic blocks interconnected by configurable routing resources.

CIB 108 facilitates the interfacing of user logic 106 with SPI controller 102 through a memory select signal (labeled SPI_SEL), a plurality of memory address signals (labeled SPI_ADDR and provided over a bus in the illustrated embodiment), and a reconfiguration signal (labeled RCG). Counter 114 is used by PLD 100 during its boot sequence to aid PLD 100 in determining whether configuration data has been properly loaded into PLD 100. JTAG block 116 provides a refresh instruction to SPI controller 102 which may be received through a JTAG port 160 of PLD 100.

As illustrated, SPI pins 118 may interface with devices external to PLD 100, such as for example external memory devices 130 and 140 (i.e., through standard SPI pins labeled D, C, S', and Q as shown in FIG. 1). In one embodiment, external memory devices 130 and 140 may be implemented as non-volatile memories (for example, flash memories, EEPROMs, EPROMs, PROMs, ROMs, or other types of non-volatile memories) and may include a plurality of memory blocks 132 (labeled Block 0, 1, X, Y, and Z) and 142 (labeled Block 0, A, B, C, and D), respectively.

Each of memory blocks 132 and 142 (also referred to as sectors) may store configuration data (for example, a configuration data bitstream or other data pattern) which may be loaded into PLD 100 through the use of SPI pins 118 and programmed into configuration memory 150 (for example, volatile SRAM memory) of PLD 100. In one embodiment, individual memory blocks 132 and 142 of external memory devices 130 and 140 may comprise approximately 512 Kbytes.

For example, Block 0 of external memory device 130 holds configuration data referred to as golden boot data 134 (also referred to as default boot data) that, when programmed into configuration memory 150 of PLD 100, will cause PLD 100 to operate in a known stable state. Block 1 of external memory device 130 holds configuration data referred to as primary boot data 136 that may be loaded upon power up of PLD 100. This block may also be selectively erased and reprogrammed by a user, thereby allowing PLD 100 to be reconfigured with an updated version of primary boot data 136 when powered up. The remaining blocks of external memory devices 130 and 140 may optionally hold various alternate sets of configuration data which may also be erased, reprogrammed, and/or selected for loading into PLD 100.

PLD 100 may be implemented to be configured or reconfigured using configuration data from any portion of external memory devices 130 and 140 in response to signals provided by CIB 108. For example, memory select signal SPI_SEL may be used to select one of external memory devices 130 and 140. Address select signal SPI_ADDR may be used to select a memory address corresponding to one of memory blocks 132 or 142 that contains configuration data to be loaded and programmed into PLD 100. Reconfiguration signal RCG may be used to trigger a reconfiguration of PLD 100 in which PLD 100 loads configuration data residing in the particular SPI memory and memory block specified by memory select signal SPI_SEL and address select signal SPI_ADDR.

Figure 2:
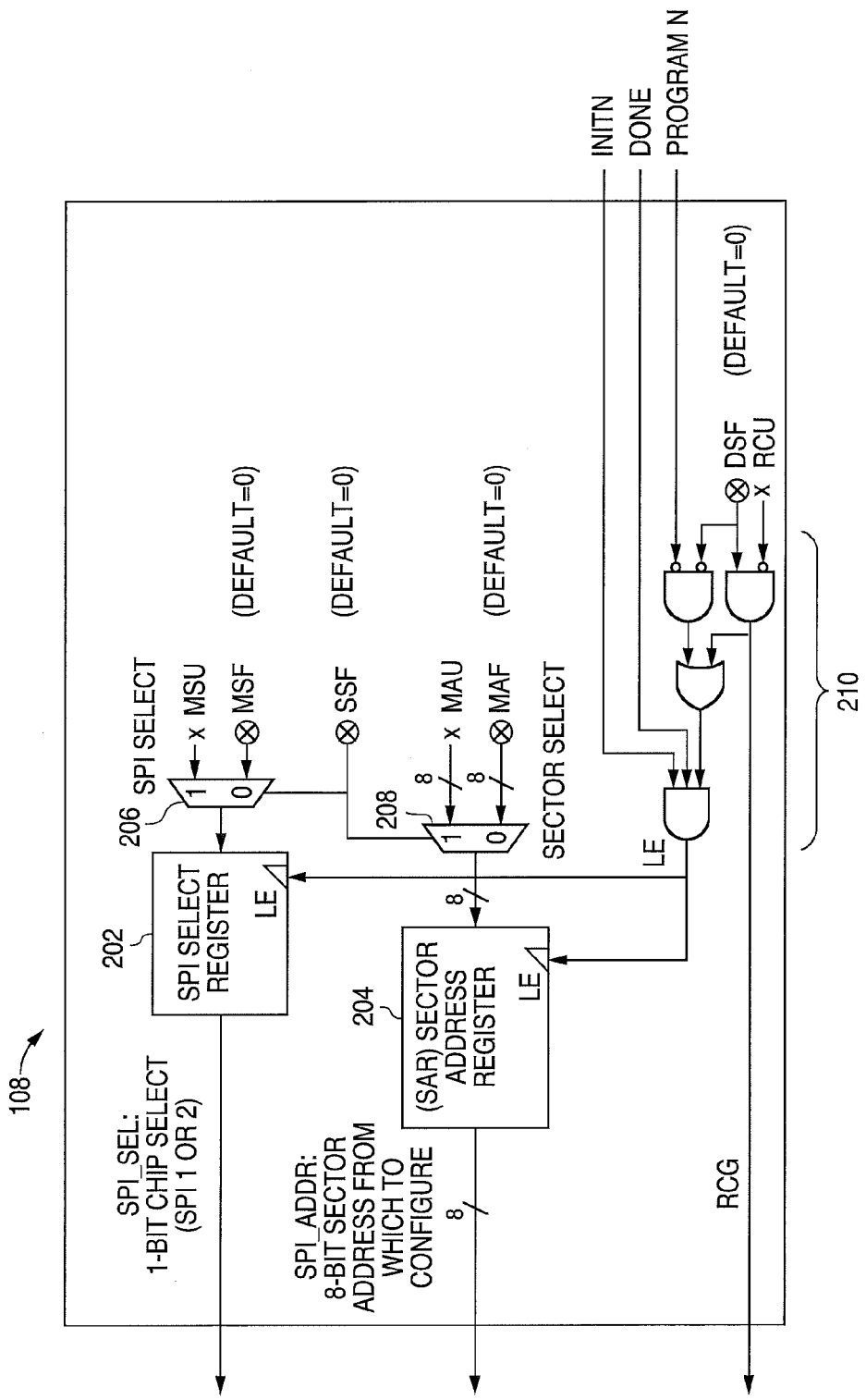
FIG. 2 illustrates a block diagram a common interface block (CIE) which may be used to trigger a reconfiguration of a PLD in accordance with an embodiment of the invention.

FIG. 2 illustrates a block diagram of CIB 108 which may be used to trigger a reconfiguration of PLD 100 in accordance with an embodiment of the invention. As shown in FIG. 2, CIB 108 includes a memory select register 202 (labeled SPI Select Register), a memory address register 204 (labeled (SAR) Sector Address Register), a multiplexer 206 (labeled SPI Select), a multiplexer 208 (labeled Sector Select), and logic 210.

CIB 108 receives a memory select signal MSF, a source select signal SSF, a memory address signal MAF, and a disable signal DSF that correspond to logic values set by configuration data stored in configuration memory 150 or set by fuses of PLD 100. CIB 108 also receives a memory select signal MSU, a memory address signal MAU, and a reconfiguration signal RCU that correspond to logic values set by user logic 106. In addition, CIB 108 receives signals INITN, DONE, and PROGRAMN from INITN pin 126, DONE pin 128, and PROGRAMN pin 122, respectively.

Memory select register 202 stores a logic value used to provide memory select signal SPI_SEL to SPI controller 102. In this regard, the logic value stored by memory select register 202 corresponds to a particular one of external memory devices 130 and 140. For example, in one embodiment, a logic low value may correspond to external memory device 130 and a logic high value may correspond to external memory device 140.

Memory address register 204 stores a memory address corresponding to the address of one of memory blocks 132 or 142 of external memory device 130 or 140 that includes configuration data to be loaded into configuration memory 150. The contents of address register 204 may be provided to SPI controller 102 through memory address signals SPI_ADDR.

As shown in FIG. 2, multiplexer 206 selectively provides one of memory select signal MSF or memory select signal MSU to memory select register 202 depending on the logic value of source select signal SSF. Similarly, multiplexer 208 selectively provides memory address signals MAF or memory address signals MAU to memory select register 204 depending on the logic value of source select signal SSF. Accordingly, the configuration data identified for loading into PLD 100 may be selected by either: memory select signal MSF and memory address signals MAF; or memory select signal MSU and memory address signals MAU. Memory select register 202 and memory address register 204 store (e.g., latch or capture) the logic values provided by multiplexers 206 and 208, respectively, in response to a latch signal LE provided by logic 210.

PLD 100 includes means such as user logic 106 for generating a reconfiguration signal internally within PLD 100 to trigger a reconfiguration of PLD 100. For example, user logic 106 may be implemented to generate reconfiguration signal RCU to trigger such a reconfiguration. In this regard, it will be appreciated that user logic 106 may be configured (e.g., by configuration data stored by configuration memory 150) to perform various logic operations. In the course of performing such logic operations, user logic 106 may adjust the logic value of reconfiguration signal RCU to attempt a reconfiguration of PLD 100. For example, in one embodiment, user logic 106 may cause reconfiguration signal RCU to transition from a first logic value to a second logic value. In another embodiment, user logic 106 may cause reconfiguration signal RCU to toggle between first and second logic values. As shown in FIG. 2, disable signal DSF may selectively enable or disable the passing of reconfiguration signal RCU through logic 210 to provide reconfiguration signal RCG.

In various embodiments, a reconfiguration of PLD 100 may be triggered either by an internal signal generated by PLD 100 or by an external signal or instruction received by PLD 100 (e.g., by the toggling of PROGRAMN pin 122 or the receipt of a refresh instruction received through a JTAG port of PLD 100). The following Table 1 identifies the operation of various signals for several types of reconfiguration operations:

TABLE 1

| Reconfiguration Triggering Source | Address Source | DSF | SSF | Toggle | Functional Description of [DONE, INITN] Signal Values [High, High] | [Low,Low], [Low,High], [High, Low] |
|---|---|---|---|---|---|---|
| External to PLD | MAF | 0 | 0 | PROGRAMN Pin | Capture logic values of MAF into address register | Keep the current stored value in address register |
|  | MAU | 0 | 1 |  | Capture logic values of MAU into address register |  |
| Internal to PLD | MAF | 1 | 0 | RCU | Capture logic values of MAF into address register |  |
|  | MAU | 1 | 1 |  | Capture logic values of MAU into address register |  |

As shown in Table 1, in one embodiment a reconfiguration operation is triggered from a source external to PLD 100 through the toggling of PROGRAMN pin 122. In this case, disable signal DSF is set to a logic low value (e.g., zero), and logic 210 sets reconfiguration signal RCG to a logic low value, regardless of the logic value of reconfiguration signal RCU.

If signals DONE and INITN both provide logic high values while signal PROGRAMN transitions to a logic high value, then latch signal LE also transitions to a logic high value to cause memory select register 202 and address register 204 to store the logic values currently received from multiplexers 206 and 208, respectively. In this regard, if source select signal SSF is set to a logic low value, then multiplexers 206 and 208 pass logic values from memory select signal MSF and memory address signals MAF, respectively. If source select signal SSF is set to a logic high value (e.g., one), then multiplexers 206 and 208 pass logic values from memory select signal MSU and memory address signals MAU, respectively.

If signals DONE and INITN do not both provide logic high values while signal PROGRAMN transitions to a logic high value, then latch signal LE remains set to a logic low value. As a result, memory select register 202 and address register 204 provide their currently stored values as memory select signal SPI_SEL and memory address signals SPI_ADDR, respectively, to SPI controller 102.

As also shown in Table 1, in another embodiment where a reconfiguration operation is triggered internally by PLD 100 by user logic 106 through reconfiguration signal RCU, disable signal DSF is set to a logic high value. In this case, logic 210 sets reconfiguration signal RCG to a logic value corresponding to reconfiguration signal RCU.

If signals DONE and INITN both provide logic high values while reconfiguration signal RCU transitions to a logic high value, then latch signal LE also transitions to a logic high value to cause memory select register 202 and address register 204 to store the logic values currently received from multiplexers 206 and 208, respectively. In this regard, if source select signal SSF is set to a logic low value, then multiplexers 206 and 208 provide logic values from memory select signal MSF and memory address signals MAF, respectively. If source select signal SSF is set to a logic high value, then multiplexers 206 and 208 provide logic values from memory select signal MSU and memory address signals MAU, respectively.

If signals DONE and INITN do not both provide logic high values while reconfiguration signal RCU transitions to a logic high value, then latch signal LE remains in a logic low value. As a result, memory select register 202 and address register 204 provide their currently stored values as memory select signal SPI_SEL and memory address signals SPI_ADDR, respectively, to SPI controller 102.

Figure 3:
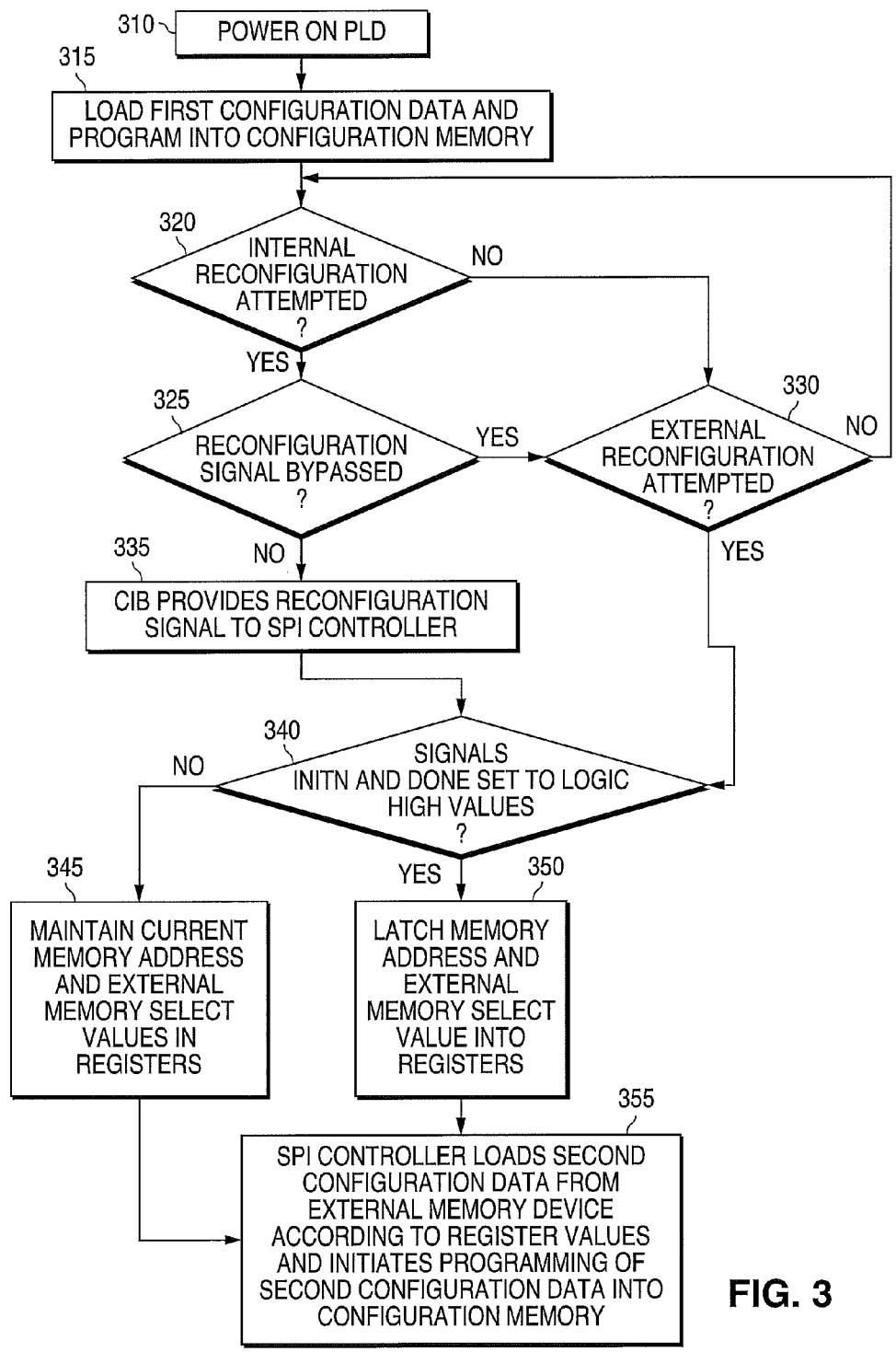
FIG. 3 illustrates a process of reconfiguring a PLD in accordance with an embodiment of the invention.

FIG. 3 illustrates a process of reconfiguring PLD 100 in accordance with an embodiment of the invention. In step 310, PLD 100 is powered on. In this regard, it will be appreciated that at the time step 310 is performed, configuration data may not yet be stored by configuration memory 150 (for example, in an embodiment where configuration memory 150 is implemented as volatile memory).

In step 315, SPI controller 102 loads first configuration data from external memory device 130 and/or 140 which programmed into configuration memory 150. For example, in one embodiment, SPI controller 102 may be implemented with preprogrammed or hardwired circuitry to load primary boot data from memory block 136 of external memory device 130 in response to the powering up of PLD 100.

After the first configuration data is programmed into configuration memory 150, user logic 106 will be configured to perform various logic operations specified by the first configuration data. In one embodiment, the logic values provided by memory select signal MSF, source select signal SSF, memory address signal MAF, and disable signal DSF are also set by the first configuration data.

After PLD 100 is configured by the first configuration data, user logic 106 operates to perform various logic operations as previously described. In the course of performing such logic operations, if user logic 106 adjusts the logic value of reconfiguration signal RCU to attempt a reconfiguration of PLD 100 (step 320), then the process continues to step 325. Otherwise, the process continues to step 330.

In step 325, if reconfiguration signal RCU has not been bypassed (for example, by logic 210 in response to disable signal DSF), then the process continues to step 335 where CIB 108 provides reconfiguration signal RCG to SPI controller 102. Otherwise, the process continues to step 330.

In step 330, if a reconfiguration operation is triggered externally to PLD 100 (e.g., if a PROGRAMN pin 122 is toggled or if a JTAG refresh instruction is received by PLD 100), then the process continues to step 340. Otherwise, the process returns to step 320.

In steps 340 to 350, memory address and memory select values are selectively captured by memory select register 202 and address register 204. In this regard, if signals INITN and DONE are both set to logic high values (step 340), then the process continues to step 350. Otherwise, the process continues to step 345.

In step 345, memory select register 202 and address register 204 maintain their current logic values. However, in step 350, logic 210 causes latch signal LE to transition to a logic high value. As a result, the current logic value provided by multiplexer 206 (e.g., corresponding to either memory select signal MSU or memory select signal MSF as selected by source select signal SSF) is stored in memory select register 202. Also in step 350, the current logic values provided by multiplexer 208 (e.g., corresponding to either memory address signals MAU or memory address signals MAF as selected by source select signal SSF) is stored in address register 204.

In step 355, a reconfiguration triggered by either reconfiguration signal RCG (provided in step 335) or the toggling of PROGRAMN pin 122 (provided in step 330) is performed. Accordingly, in step 355, SPI controller 102 loads second configuration data from the particular one of memory blocks 132 or 142 identified by the values stored in memory select register 202 and address register 204. Also in step 355, SPI controller 102 initiates the programming of the second configuration data into configuration memory 150. Therefore, following such programming, user logic 106 of PLD 100 will be configured according to the second configuration data.

Embodiments described above illustrate but do not limit the invention. For example, the configuration data storage memory is not limited to external memory devices, but may include internal memory such as a non-volatile memory die separate from the PLD die but contained within the same PLD package or non-volatile memory embedded in the PLD die. It should also be understood that numerous modifications and variations are possible in accordance with the principles of the present invention. Accordingly, the scope of the invention is defined only by the following claims.

We claim:

1. A programmable logic device (PLD) comprising:
    configuration memory adapted to store first configuration data for configuring the PLD;
    a bus interface adapted to interface with configuration data storage memory;
    a bus interface controller responsive to an internally generated reconfiguration signal for loading second configuration data into the configuration memory from the configuration data storage memory via the bus interface, the second reconfiguration data for reconfiguring the PLD; and
    logic responsive to an internally generated disable signal to disable transmission of the reconfiguration signal to the bus interface controller.

2. The PLD of claim 1, wherein the bus interface controller is adapted to initiate programming of the configuration memory with the second configuration data.

3. The PLD of claim 1, wherein the configuration data storage memory is a memory device external to the PLD.

4. The PLD of claim 1, wherein the configuration data storage memory is non-volatile memory internal to the PLD.

5. The PLD of claim 1 including user logic configurable by the first configuration data to provide the internally generated reconfiguration signal.

6. The PLD of claim 1, wherein the bus interface controller is adapted, in response to an internally generated select signal, to select a configuration data storage memory from among a plurality of configuration data storage memories.

7. The PLD of claim 1, wherein the bus interface controller is adapted, in response to an internally generated signal, to select a memory block from among a plurality of memory blocks within the configuration data storage memory.

8. The PLD of claim 1, wherein the bus interface is a serial interface.

9. A method of configuring a programmable logic device (PLD), the method comprising:
   providing first configuration data in a configuration memory of the PLD to configure the PLD for its intended function;
   generating a reconfiguration signal internally within the PLD to trigger a reconfiguration of the PLD;
   generating a disable signal internally within the PLD;
   if the disable signal has a first logic value:
      loading second configuration data into the configuration memory from external configuration data storage memory in response to transmission of the reconfiguration signal; and
      programming the configuration memory with the second configuration data; and
   if the disable signal has a second logic value:
      disabling transmission of the reconfiguration signal.

10. The method of claim 9, wherein generating the reconfiguration signal is performed by user logic of the PLD configured by the first configuration data.

11. The method of claim 9, wherein the loading comprises loading the second configuration data from one of a plurality of memory blocks within the configuration data storage memory.

12. The method of claim 9, wherein the loading comprises loading the second configuration data from one of a plurality of separate configuration data storage memories.

13. The method of claim 9, wherein the loading comprises loading the second configuration data from the configuration data storage memory through a serial interface.

14. A system comprising:
   at least one external memory device having at least two memory blocks, a first memory block storing a first configuration data set and a second memory block storing a second configuration data set; and
   a programmable logic device (PLD) coupled to the at least one external memory device, the PLD including:
      configuration memory adapted to store a configuration data set for configuring the PLD;
      a bus interface adapted to interface with the at least one external memory device; and
      a bus interface controller for loading the first configuration data set into the configuration memory from a memory block of the at least one external memory device via the bus interface,
   wherein the bus interface controller is responsive to an internally generated reconfiguration signal to reconfigure the PLD by replacing the first configuration data set stored in the configuration memory with the second configuration data set.

15. The system of claim 14, wherein the bus interface controller is adapted to initiate programming of the configuration memory with the second configuration data set.

16. The system of claim 14, wherein the bus interface controller is adapted, in response to an internally generated select signal, to select an external memory device from among a plurality of external memory devices.

17. The system of claim 14, wherein the bus interface controller is adapted, in response to an internally generated select signal, to select a memory block from among the at least two memory blocks within the at least one external memory device.

18. The system of claim 14, wherein the bus interface is a serial interface.

19. The system of claim 14, wherein the PLD includes user logic configurable by the first configuration data set to provide the internally generated reconfiguration signal.

20. The system of claim 14, wherein the PLD includes logic responsive to an internally generated disable signal to disable transmission of the reconfiguration signal to the bus interface controller.

* * * * *